United States Patent [19]
Jarocinski et al.

[11] Patent Number: 4,539,070
[45] Date of Patent: Sep. 3, 1985

[54] EXPOSURE OF PHOTO RESIST

[75] Inventors: Richard Jarocinski, Wood Dale; William R. Keaton, Genoa; Joseph L. Magennis, Bensenville, all of Ill.

[73] Assignee: GTE Automatic Electric Incorporated, Northlake, Ill.

[21] Appl. No.: 563,837

[22] Filed: Dec. 21, 1983

[51] Int. Cl.³ .............. C23F 1/02; B44C 1/22; C03C 15/00; C03C 25/06
[52] U.S. Cl. ................. 156/659.1; 156/901; 430/5; 430/313
[58] Field of Search ........... 156/659.1, 661.1, 901, 156/902; 430/5, 313, 316, 317, 318, 323; 427/43.1

[56] References Cited

U.S. PATENT DOCUMENTS 4,413,051 11/1983 Thomas ............... 156/902 X
4,465,759 8/1984 Duly et al. ............ 430/321
4,499,162 2/1985 Banks et al. ........... 430/5

Primary Examiner—William A. Powell
Attorney, Agent, or Firm—Charles A. Doktycz

[57] ABSTRACT

A method and apparatus for limiting the interference caused by shadows of minute particles of opaque matter that settles on the surface of an assembly of a metal substrate, a resist and an overlay by placing a second glass overlay on top of the assembly to raise the surface to a level where the shadows of any particles resting there will be diffused.

2 Claims, 2 Drawing Figures

EXPOSURE OF PHOTO RESIST

FIELD OF THE INVENTION

This invention relates to the manufacture or printed circuit boards. More particularly, this invention relates to an improvement for minimizing the occurrence of defects during the exposure of the photo resist to a desired pattern.

BACKGROUND OF THE INVENTION

During the manufacture of printed circuit cards, a clean metal surface or substrate is coated with a photo resist. A mask having the desired pattern is then placed over the resist and exposed to light of an appropriate wavelength which hardens the resist in the exposed areas. The resist film is then washed to disolve the unexposed resist and thereby uncover part of the metal substrate. The board may now be further treated to render the exposed photo resist etch resistant, after which the uncoated substrate is etched away and the remaining resist can be removed. In the continued effort to decrease the bulk of electronic equipment, there has been a trend to produce boards with a higher density of components. This tendency has brought about a consequent greater density of desired circuit lines that must be created on the board. As a consequence the circuit lines are placed closer together. This closeness of the lines on the board has been followed by a number of production problems. Various defects can occur during the exposure operation, including thermal expansion of the pattern and lack of exposure of the resist due to unwanted opaque particles close to the pattern blocking radiation. Small opaque particles may cling to the mask and be reproduced on the final circuit board as an undesired open connection of a number of the lines.

SUMMARY OF THE INVENTION

Accordingly, it is a principal object of the invention to provide a process of producing a printed wiring circuit board which can be less expensively manufactured.

It is another object of the invention to provide a process for exposing the photo resist to a circuit mask whereby small defects or particles will not produce defective patterns.

In accordance with the invention there is provided a process involving the placing of a clear material an adequate distance from the pattern to allow for the sufficient diffusion of the radiation to prevent the particles from showing up on the exposed material, and also allow the pattern to remain at a more constant temperature and not expand or be distorted.

BRIEF DESCRIPTION OF THE DRAWING

Additional features and advantages of the apparatus and metl'od in accordance with the present invention will be better understood by reference to the following desr:ription of a preferred embodiment of the invention taken in conjunction with the accompanying drawing wherein.

DESCRIPTION OF THE PREFERRED EMBODIMENT

Figure 1:
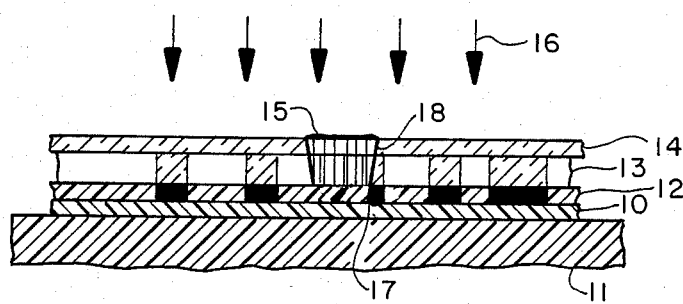
FIG. 1 is a schematic cross-sectional illustration showing the different materials in a conventional work piece prepared for exposure.

A typical arrangement of the components for exposing a coated substrate is shown in FIG. 1. The substrate 10 is shown resting on a support surface 11. The resist that is to be exposed is visible as the layer 12. The artwork that is prepared to permit the passage of light at all of the areas of the substrate that are required for the circuit conductors is shown at 13. A cover sheet 14 overlays the remainder of the package to protect it physically. As may be seen from the illustration light or other radiation shown by the lines 16 passes through the transparent areas of the artwork or mask to cause a chemical change in the exposed area. This area then remains after subsequent treatment to protect the substrate during an etching process. Any particles such as shown at 15 that may settle onto the cover sheet 14 will block the passage of light with the consequent circuit lines below the particle remaining unexposed and will therefore be etched away during subsequent processing of the circuit board, resulting in the production of a defective circuit board.

Figure 2:
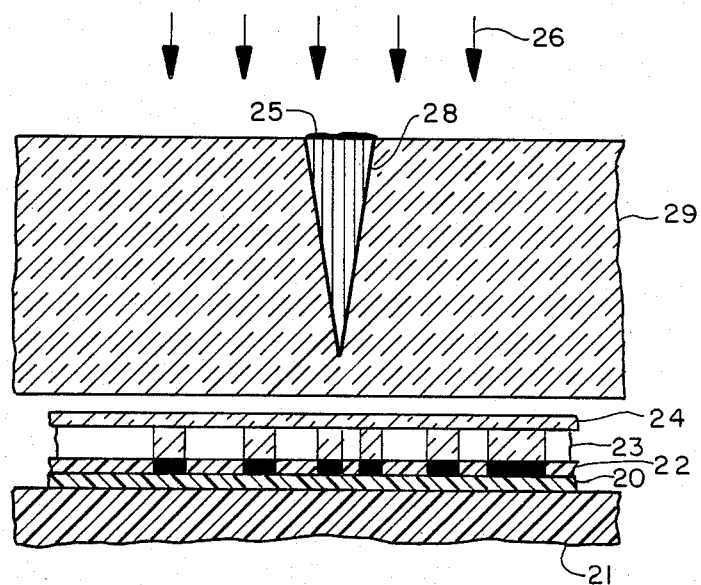
FIG. 2 is also a schematic cross-sectional illustration showing the different materials in a work piece prepared for exposure according to the invention.

The illustration shown on FIG. 2 illustrates a similar arrangement of components for exposure. The substrate 20 on the support surface 21 is overlaid with the artwork or mask 23 and also with a cover sheet 24. However, in this improved embodiment there is also included a second transparent cover sheet of a thickness such that small particles that may rest on it will not totally obstruct the passage of light. Because of the distance to the mask, the light will be sufficiently diffused so as to cause no problem. An example showing this may be seen here where a particle 25 is shown resting on the second cover surface with its shadow 28 shown as a cone that does not reach the surface of the mask or resist. This second cover sheet is preferably of a material such as glass that can obstruct the passage of radiant heat and present the additional benefit of decreasing the distortion due to expansion of the mask from the radiant heat.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A method of reducing the production of defective circuit boards due to the presence of minute opaque particles that may settle onto the cover surface of an assembly of a mask, a resist and a metal substrate prior to exposing said resist to radiation including the step of placing a second cover sheet over said assembly of a thickness sufficient to permit the diffusion of any shadows produced by minute particles resting on the cover surface.

2. A method as claimed in claim 1, wherein said second cover sheet is of glass.

* * * * *